METHODS OF MANUFACTURING SEMICONDUCTOR DEVICES

Filed May 28, 1968 5 Sheets-Sheet 1

INVENTORS
JOHN A. KERR
ERIC WADHAM
BY
Frank R. Trifari
AGENT

METHODS OF MANUFACTURING SEMICONDUCTOR DEVICES

Filed May 28, 1968 5 Sheets-Sheet 2

INVENTORS.
JOHN A. KERR
ERIC WADHAM
BY
Frank R. Trifari
AGENT

INVENTORS
JOHN A. KERR,
ERIC WADHAM

Frank R. Trifari
AGENT

July 27, 1971 J. A. KERR ET AL 3,595,716

METHODS OF MANUFACTURING SEMICONDUCTOR DEVICES

Filed May 28, 1968 5 Sheets-Sheet 4

INVENTORS.
JOHN A. KERR
ERIC WADHAM
BY
[signature]
AGENT

METHODS OF MANUFACTURING SEMICONDUCTOR DEVICES

Filed May 28, 1968 5 Sheets-Sheet 5

INVENTORS.
JOHN A. KERR
ERIC WADHAM

BY Frank R. Trifari
AGENT

United States Patent Office
3,595,716
Patented July 27, 1971

3,595,716
METHOD OF MANUFACTURING SEMICONDUCTOR DEVICES

John Anthony Kerr, Harrow, and Eric Wadham, Saint Albans, England, assignors to U.S. Philips Corporation, New York, N.Y.

Filed May 28, 1968, Ser. No. 732,626
Claims priority, application Great Britain, May 16, 1968, 24,762/68
Int. Cl. H01l 7/54
U.S. Cl. 148—187 9 Claims

ABSTRACT OF THE DISCLOSURE

A method of fabricating a transistor having emitter, base and collect or regions is disclosed. In a first operation there is formed in a semiconductor body part of one conductivity type at one surface thereof a shallow surface emitter region by incorporating therein a relatively high concentration of one-type forming impurities. Next ions of an impurity of the opposite conductivity type are implanted into said body part from said one surface over an area encompassing but larger than the emitter region and to a depth deeper than the emitter region such that the ions extend through the previously made emitter region to form a base region, said base ion impurity concentration exceeding the impurity concentration of the initial body part but being less than the emitter impurity concentration forming an opposite type base region defining spaced collector and emitter junctions which extend to the said one surface. Finally, the assembly is subjected to a base annealing treatment to remove semiconductor ion damage.

This invention relates to methods of manufacturing semiconductor devices comprising a transistor having emitter, base and collector regions, for example a semiconductor device consisting of a discrete transistor, or a semiconductor integrated circuit including a transistor. The invention relates particularly, but not exclusively, to methods of manufacturing semiconductor devices comprising high frequency planar transistors. A planar transistor is to be understood to mean herein a semiconductor body or body part comprising a collector region of the one conductivity type, a base region of the opposite conductivity type and an emitter region of the one conductivity type, the base/collector junction surrounding the emitter/base junction within the semiconductor body or body part and both said junctions terminating at one surface, for example a plane surface, of the semiconductor body or body part below adherent protective insulating material on the one surface.

In semiconductor technology the process of ion implanation has been employed in the manufacture of silicon solar cells and radiation detectors. Ion implanatation involves the bombardment of semiconductor material with beams of energetic dopant ions to form regions of different conductivity and/or conductivity type. It has been proposed previously to employ the process of ion implantation in the manufacture of high frequency transistors since this process has the potential of yielding precise control of junction depths and the fine geometries required in such transistors. Ion implantation, as opposed to diffusion, as a process for determining the base region of a transistor is capable of yielding a higher impurity concentration and an improved impurity concentration gradient in the base region. This leads to an improvement in the base series resistance and therefore a lower noise figure. Also the improved impurity concentrations gradient yields an improved built-in drift field.

Various experiments have been carried out by the applicants to produce silicon transistors using the process of ion implantation. In conventional planar transistor manufacture by a double diffusion process the base region is formed by the diffusion of a conductivity type determining impurity element characteristic of the opposite conductivity type into a limited surface portion of a semiconductor body or body part of the one conductivity type and thereafter the emitter region is formed by the diffusion of a conductivity type determining impurity element characteristic of the one conductivity type into a further limied surface portion of the semiconductor body or body part such that the emitter region obtained lies internal to the previously formed base region. In one of the aforesaid experiments the above described manufacture was modified by forming the emitter by ion implantation, this being referred to as a hybrid, base diffusion and emitter ion implantation process.

The process of ion implantation involves damage to the crystalline structure of the semiconductor material and in order to restore the crystalline form an annealing step has to be performed subsequent to the bombardment with energetic dopant ions.

In order to produce a substantially uniform doping level in an implanted emitter region the implantation was carried out in steps of increasing energy. In addition, theory shows that it is also necessary to implant in steps of increasing dose to obtain this uniform level. A further important consideration is the dependance of percentage of the implanted ions which are located in substitutional lattice sites and thus able to contribute to conduction mechanisms on the post-implantation annealing step. At very high concentrations, for example $10^{20}$ impurity atoms per cc. and greater, necessary for a high injection efficiency emitter, an annealing temperature in the region of 900° C. has to be used. In the aforesaid experiments this annealing step is carried out at a late stage in the manufacture, this is after the implantation of the ions which determine the emitter. Precise control of emitter concentrations and junction depths have been found difficult to obtain because during the said high temperature annealing treatment a redistribution of the implanted ions which determine the emitter occurs and the diffusion of the base impurity is locally enhanced under the emitter region such that the base/collector junction is locally pushed forward below the emitter. The latter effect is commonly observed in the manufacture of double diffused silicon n-p-n transistors and is referred to as the "Emitter dip or base push-out effect" and is found to occur in the aforesaid method employing an emitter ion implantation in the formation of both n-p-n silicon transistors and p-n-p silicon transistors, although to a lesser degree in the latter devices. This effect makes control of base region widths difficult and when occurring to a substantial extent leads to formation of transistors having a poor frequency response. Similar results are predicted in a method in which a base ion implantation is performed prior to the emitter ion implantation since the high temperature annealing step after the emitter ion implantation is still involved.

According to the invention, in a method of manufacturing a semiconductor device comprising a transistor having emitter, base and collector regions, in a semiconductor body or body part of one conductivity type an emitter region concentration of a conductivity type determining impurity element characteristic of the one conductivity type is initially provided extending to one surface of the semiconductor body or body part and thereafter the base region and the locations of the emitter/base junction and the collector/base junction are determined simultaneously by the implantation of ions of a conductivity type determining impurity element characteristic of the opposite conductivity type, the implantation of said ions being into said one surface and extending through the portion of the semiconductor body or body part containing the previously provided emitter region concentration. The term "implantation of ions of an impurity elements characteristic of the opposite conductivity type" used herein is to be understood to include an annealing step subsequent to the implantation when present in such a method, it being clear that the final location of the said junctions may only be determined in certain cases during such an annealing step.

The advantages of such a method will be described hereinafter with particular reference to two preferred forms of the method but generally the adoption of an ion implantation process for determining the base region has the advantages, as previously described, of yielding a lower base series resistance and an improved built-in base drift field. Furthermore by the sequence of the basic steps of the method, in which the ion implantation of the base impurity is carried out after providing the emitter region concentration, the "emitter dip" or "base push-out" effect does not occur. This results in that the impurity concentration profile of the base region and its thickness can be controlled to a greater degree and narrow base widths are obtainable in a reproduceable manner.

In one preferred form of the method the emitter region concentration is provided by the implantation of ions of an element characteristic of the one conductivity type into said one surface and thereafter the semiconductor body or body part is subjected to an annealing treatment prior to the implantation of ions of the element characteristic of the opposite conductivity type to determine the base region. This method of forming a transistor by a double ion implantation process does not involve the occurrence of the "emitter-dip" or "base pushout" effect since the relatively high temperature annealing treatment necessary after the emitter ion implantation is now performed prior to the base ion implantation which itself may be followed by a relatively low temperature annealing treatment.

The method may be employed in the manufacture of semiconductor devices comprising a planar transistor but is not confined thereto, it being readily possible to fabricate mesa transistors by the method.

In the said preferred form of the method in which the emitter region concentration is provided by ion implantation, the said emitter ion implantation may be effected in the presence of an insulating layer, for example of silicon oxide, on the one surface and the area of implantation is confined to a limited surface portion of the semiconductor body or body part by the presence of a metal masking layer, for example of aluminium, on the insulating layer. This technique will yield, subsequent to the base ion implantation, an emitter/base junction which terminates at the said one surface and may be employed, for example, in the manufacture of a semiconductor device comprising a planar transistor.

In another preferred form of the method the emitter region concentration is provided by the diffusion of an element characteristic of the one conductivity type into the one surface of the semiconductor body or body part. This method which is a hybrid, diffusion and ion implantation process, also does not involve the occurrence of the "Emitter dip" or "base push-out" effect, the annealing treatment after the base implantation being carried out at a relatively low temperature.

Furthermore in a method according to the invention for forming a device comprising a planar transistor the base ion implantation of the element characteristic of the opposite conductivity type may also be effected in the presence of an insulating layer, for example of silicon oxide, on the one surface and the area of implantation is confined to a limited surface portion of the body of the semiconductor body or body part by the presence of a masking layer, for example of aluminium, on the insulating layer.

In the said preferred form of the method in which the emitter region concentration is provided by the diffusion of an element characteristic of the one conductivity type, said diffusion may be effected into a portion of the one surface exposed by an opening in the insulating layer on the one surface, and the subsequent implantation of ions of the element characteristic of the opposite conductivity type effected through a portion of said insulating layer. In this method subsequent to the implantation of ions characteristic of the opposite conductivity type, an emitter contact metal layer may be applied in a relocated opening in the insulating layer corresponding substantially to the initially formed opening in the layer exposing the surface portion into which the element characteristic of the one conductivity type is diffused.

Various techniques may be employed for relocating said opening. However when it is desired to manufacture a transistor suitable for very high frequency operation it is desirable in many cases to make the emitter diffusion opening of a width as small as can be achieved by the presently available photoprocessing and etching techniques. Consequently in order to provide the emitter contact the precise relocation of such an opening at a later stage in the processing is essential and gives rise to certain difficulties in as much as errors in mask registration are not tolerable. Therefore in a preferred method in which the opening is relocated, in the initially formed opening a glass insulating layer portion is formed during the diffusion of the element characteristic of the one conductivity type into the surface portion thereby exposed, and subsequent to the implantation of ions of an element characteristic of the opposite conductivity type and prior to applying the emitter contact metal layer the opening is relocated by selectively etching the glass insulating layer portion without substantially removing the adjacent parts of the insulating layer.

In this method the implantation of ions characteristic of the opposite conductivity type is effected partially through the glass insulating layer portion and partially through the adjacent parts of the insulating layer. Generally the glass insulating layer portion may have a thickness which is less than that of the adjacent parts of the insulating layer. This may give rise to the ions having a deeper penetration in the part of the semiconductor body immediately below the glass layer which in turn may give rise to the collector/base junction extending slightly deeper in this part of the body. In order to overcome this problem, subsequent to the diffusion of the element characteristic of the one conductivity type and prior to the implantation of ions of an element characteristic of the opposite conductivity type, an anodic oxidation step may be performed to selectively increase the thickness of the glass insulating layer portion until the thickness of the resultant insulating layer portion corresponds substantially to the thickness of the adjacent parts of the insulating layer. It is found that in a later stage of the processing such an anodic oxide can be etched selectively together with the glass insulating layer portion without substantially removing the adjacent parts of the insulating layer.

The method may be employed in the manufacture of devices comprising silicon transistors of n-p-n or p-n-p configuration. Although the method will only be described particularly hereinafter with reference to the manufacture of silicon transistors its application to the manufacture of transistors of other semiconductor materials, for example germanium and gallium arsenide, will be apparent.

Other features of the invention will be apparent from the following description of various embodiments of the method now to be described, by way of example, with reference to the accompanying diagrammatic drawings in which.

The ion implantation apparatus suitable for use in the embodiments now to be described in which implantation of boron or phosphorus ions in silicon is effected comprises a radio frequency ion source fed with either boron trichloride or phosphorus trichloride gas respectively. The accelerated ion beam consists of a number of ion species in addition to boron or phosphorus and it is therefore necessary to analyse the beam magnetically before it enters a target chamber in which the silicon body is located. Care is taken to minimise the amount of organic background gases from pumps by fitting traps to the backing lines, and by using liquid nitrogen trapped diffusion pumps for the accelerator drift tube.

In the first embodiment now to be described with reference to FIGS. 1 to 4, the starting material is a slice of silicon of approximately 2.5 cm. diameter consisting of an $n^+$-type substrate of 0.008 ohm-cm. resistivity and 200$\mu$ thickness having an n-type epitaxial layer of 0.5 ohm-cm. resistivity and approximately 3$\mu$ thickness thereon. The slice has its major surfaces normal to the (III) direction. The formation of a single device on the slice will now be described, it being assumed that where steps such as photoprocessing, diffusion and ion implantation are referred to, these operations are each carried out at a plurality of locations on the slice simultaneously such that a pluraliy of individual devices are formed on the slice which are separated by dividing the slice at a later stage of manufacture.

A layer of silicon oxide of 3,000 A. thickness is grown on the surface of the epitaxial layer by maintaining the body at 1,000° C. in a stream of wet oxygen for 45 minutes. By a photoprocessing and etching step an opening of 3$\mu$ x 20$\mu$ is made in the silicon oxide layer to expose the underlying n-type epitaxial layer.

The body is placed in a diffusion furnace and maintained at 900° C. for 15 minutes in a gas stream containing phosphorus which is derived from phosphine $PH_3$. This results in the diffusion of phosphorus into the exposed portion of the layer and the formation of an $n^+$-type region adjacent the surface where the diffused phosphorus concentration is 1–5 x $10^{20}$ atoms/cc. During the diffusion step a layer of a phosphosilicate glass is formed on the exposed surface portion of the silicon and on the surfaces of the silicon oxide layer.

Figure 1:
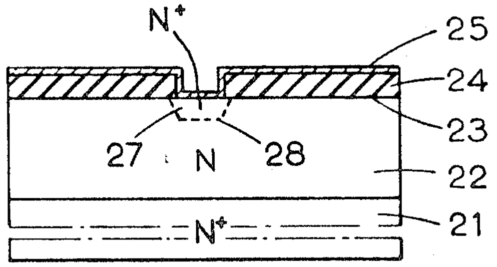
FIGS. 1, 2 and 3 show vertical sections through a semiconductor body during various stages of a first embodiment of the method for the manufacture of an n-p-n silicon epitaxial planar transistor.

FIG. 1 shows the semiconductor body after the phosphorus diffusion step with the $n^+$-type substrate 21 having the n-type epitaxial layer 22 thereon, a plane surface 23 of the layer 22 having the silicon oxide layer 24 thereon and the phosphosilicate glass layer 25 extending over the layer 24 and on the previously exposed surface portion of the n-type layer 22. The $n^+$-type region 27 formed by the phosphorus diffusion is shown with the extent of the diffusion front represented by the dotted line 28.

After removal of the body from the diffusion furnace, by a further photoprocessing and etching step, the silicon oxide layer and the glass layer are removed from the surface of the slice in the areas which are to be occupied by the transistor base regions on the slice.

The body is then placed in a furnace to effect a silane process using tetra-ethoxy-silane (TEOS), the body being heated at 450° C. in the TEOS atmosphere to effect the deposition of a silicon oxide layer of 1,000 A. thickness. A densification of the silicon oxide layer is then performed by heating for a period at 850° C.

The body is removed from the furnace and placed in an evaporation deposition apparatus and a layer of aluminium of 1.0$\mu$ thickness deposited on the surface of the silicon oxide layer.

By a further photoprocessing and etching step an opening of 25$\mu$ x 30$\mu$ is formed in the aluminium layer, the location of the previously formed $n^+$-type region 27 lying centrally disposed within this opening.

The silicon body is then placed in the target chamber of an ion implantation apparatus and implantation of boron ions is effected into the body in the area exposed by the opening in the aluminium layer. The boron ion source consists of boron trichloride. The implantation is carried out in steps either with increasing or decreasing energies in the range of 10K ev. to 130K ev. The dose is $10^{14}$ atoms/sq. cm. and the orientation of the body is such that there is an angle of 7° between the ion beam axis and the (III) direction. Implantation of boron ions occurs through the silane deposited silicon oxide layer and through the previously diffused phosphorus concentration in the $n^+$-type region 27. During a low temperature annealing treatment a base region and the locations of an emitter/base junction and a collector/base junction are simultaneously determined.

Figure 2:
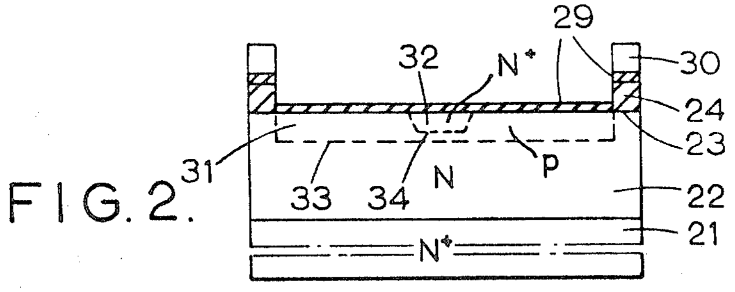

FIG. 2 shows the semiconductor body after the boron ion implantation just prior to the annealing treatment. The silane deposited silicon oxide layer 29 is shown having the masking layer of aluminium 30 thereon with an opening in the aluminium layer 30 through which the boron ion implantation has been effected to yield a p-type base region concentration 31, an $n^+$-type emitter region concentration 32, a base/collector junction 33 and an emitter/base junction 34, the junctions being shown in dotted outline in FIG. 2 as it will be appreciated that their final location is determined by the subsequent annealing treatment.

Subsequent to the boron ion implantation the residual aluminium masking layer 30 is removed and the silicon body is subjected to a relatively low temperature annealing treatment at 600° C. to 800° C. for 30 minutes in dry nitrogen.

After the annealing treatment the boron surface concentration in the base region 31 is approximately $10^{18}$ atoms/cc. The emitter/base junction 34 is situated at a depth from the surface 23 of 0.25$\mu$ and the collector/base junction 33 is situated at a depth from the surface 23 of from 0.4 to 0.5 giving a base region width of 0.15$\mu$ to 0.25$\mu$.

Figure 3:
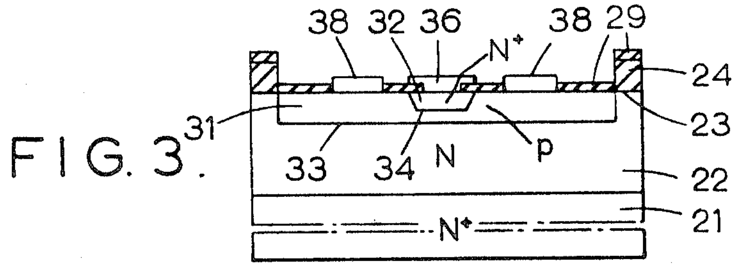
Figure 4:
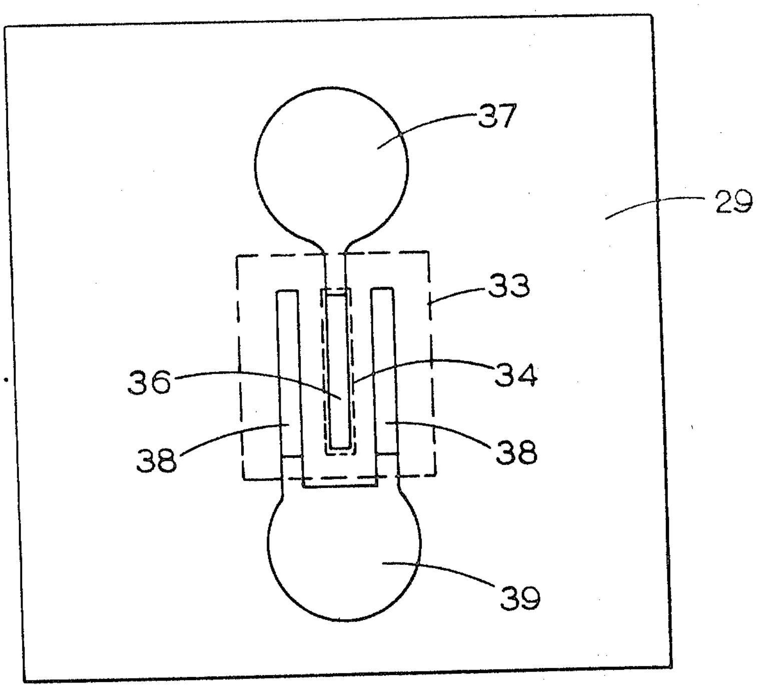
FIG. 4 shows in plan view the surface of the semiconductor body of the transistor shown in FIG. 3.

By a further photoprocessing and etching step openings are formed in the silicon oxide layer 29 to expose the emitter region 32 and base region 31 where these regions extend to the surface. The opening exposing the emitter region 32 is of approximately 1.5$\mu$ x 16$\mu$ and the two openings exposing the base region 31 are of approximately 3$\mu$ x 20$\mu$. A layer of aluminium of 0.5$\mu$ thickness is then deposited over the whole surface. The aluminium layer is then selectively removed by a further photoprocessing and etching step to leave an emitter contact layer as shown in FIGS. 3 and 4 in the form of a finger 36 of 3$\mu$ width which further extends over the silicon oxide layer 29 and terminates in a large area bonding pad 37 on the silicon oxide layer above the collector region, and a base contact layer in the form of two fingers 38 each of 3$\mu$ width which further extend over the silicon oxide layer 29 and terminate in a large area bonding pad 39 on the silicon oxide layer above the collector region.

The slice is then sub-divided into a plurality of transistor units of 350μ x 350μ which are then indiviudally mounted on a header, connections to the emitter and base bonding pads are made by wire bonding and encapsulation is effected in a manner as commonly employed in planar transistor manufacture.

In the second embodiment now to be described with reference to FIGS. 5 to 8 the starting material is the same, that is a silicon slice consisting of an $n^+$-type substrate having an n-type epitaxial layer thereon. A layer of silicon oxide of 3,000 A. thickness is grown on the surface of the epitaxial layer by maintaining the body at 1,000° C. in a stream of wet oxygen for 45 minutes. By a photo-processing and etching step an opening of 25μ x 30μ is formed in the thermally grown silicon oxide layer. A thinner layer of silicon oxide of 1,000 A. thickness is now grown on the exposed part of the silicon body by maintaining the body at 950° C. in a stream of wet oxygen for 15 minutes. The thickness of the residual portions of the initially provided 3,000 A. silicon oxide will also be increased during this step.

A layer of aluminium of 1.0μ thickness is then evaporated over the whole surface of the silicon oxide layers. By a photoprocessing and etching step an opening of 3μ x 20μ is formed in the aluminium layer to expose the underlying thin portion of the silicon oxide layer. This opening is centrally disposed within the area occupied by the 25μ x 30μ thin silicon oxide layer portion.

The silicon body is then placed in the target chamber of an ion implantation apparatus and implantation of phosphorus ions is effected into the body in the area exposed by the opening in the aluminium layer. The phosphorus ion source consists of phosphorus trichloride. The implanation energy is 80K ev., the dose is approximately $10^{16}$ atoms/sq. cm. and the orientation of the body is such that there is an angle of 7° between the ion beam axis and the (III) direction. Implantation of phosphorus ions occurs through the thin silicon oxide layer exposed by the opening in the aluminium masking layer.

Figure 5:
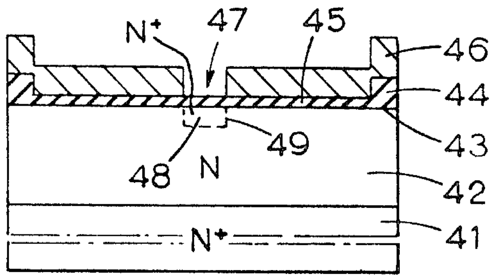
FIGS. 5, 6 and 7 show vertical sections through a semiconductor body during various stages of a second embodiment of the method for the manufacture of an n–p–n silicon epitaxial planar transistor.

FIG. 5 shows the silicon body after the phosphorus ion implantation step with the $n^+$-type substrate 41 having the n-type epitaxial layer 42 thereon, a plane surface 43 of the layer 42 having a silicon oxide layer thereon consisting of a thick portion 44 and a thin portion 45. The aluminium masking layer 46 is shown on the surface of the silicon oxide layer 44, 45 and has an opening 47 thereon. The $n^+$-type region 48 formed by the phosphorus ion implantation is shown with the extent of the phosphorus ion penetration represented by the dotted line 49.

The aluminium masking layer 46 is removed and the silicon body subjected to an annealing treatment in dry nitrogen at 900° C. for 30 minutes. After annealing the phosphorus surface concentration in the implanted $n^+$-type region 48 is approximately $10^{20}$ atoms/cc.

A further masking layer of aluminium of 1.0μ thickness is then provided on the surface of the silicon oxide layer 44, 45 by evaporation. By a photoprocessing and etching step an opening of 25μ x 30μ is formed in the aluminium layer which exposes and corresponds in position to the 25μ x 30μ thin silicon oxide layer portion 45.

The silicon body is then placed in the target chamber of an ion implantation apparatus and implantation of boron ions is effected into the body in the area exposed by the opening in the aluminium masking layer. The boron ion source and conditions of bombardment are substantially the same as described in the first embodiment. Implantation of boron ions occurs through the silicon oxide layer 45 and through the previously implanted phosphorus concentration in the $n^+$-type region 48. During annealing at a relatively low temperature a base region and the locations of an emitter/base junction and a collector/base junction are simultaneously determined.

Figure 6:
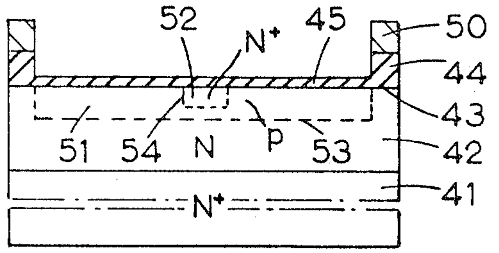

FIG. 6 shows the semiconductor body after the boron ion implantation just prior to the annealing treatment. The thicker portion 44 of the silicon oxide layer is shown having the aluminium masking layer 50 thereon with an opening therein through which the boron ion implantation has been effected to yield a p-type base region concentration 51, an $n^+$-type emitter region concentration 52, a base/collector junction 53 and an emitter/base junction 54, the junctions being shown in dotted outline as it will be appreciated that their final location is determined by the subsequent annealing treatment.

Subsequent to the boron ion implantation the residual aluminium masking layer 50 is removed and the silicon body is subjected to a relatively low temperature annealing treatment at 600° C. to 800° C. for 30 minutes in dry nitrogen.

After the annealing treatment the boron surface concentration in the base region 51 is approximately $10^{18}$ atoms/cc. The emitter/base junction 54 is situated at a depth from the surface 43 of 0.25μ and the collector/base junction 53 is situated at a depth from the surface 43 of 0.4μ to 0.5μ giving a base region width of 0.15μ to 0.25μ.

Figure 7:
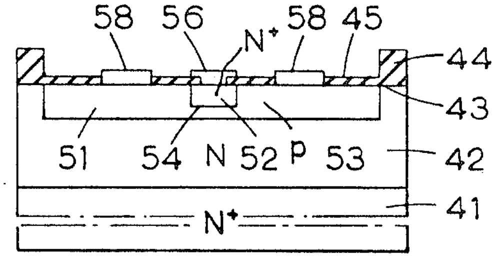
Figure 8:
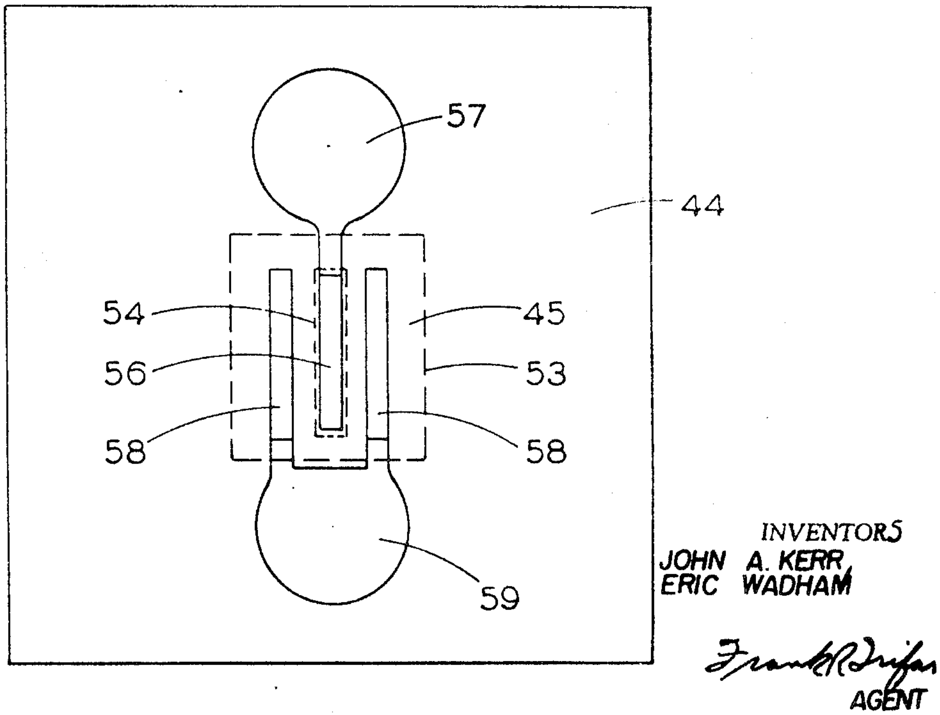
FIG. 8 shows in plan view the surface of the semiconductor body of the transistor shown in FIG. 7.

By a further photoprocessing and etching step openings are formed in the silicon oxide layer portion 45 to expose the emitter region 52 and base region 51 where these regions extend to the surface. The opening exposing the emitter region 52 is of approximately 1.5μ x 16μ and the two openings exposing the base region 51 are of approximately 3μ x 20μ. A layer of aluminium of 0.5μ thickness is then deposited over the whole surface. The aluminium layer is then selectively removed by a further photoprocessing and etching step to leave an emitter contact layer as shown in FIGS. 7 and 8 in the form of a finger 56 of 3μ width which further extends over the silicon oxide layer portions 45 and 44 and terminates in a large area bonding pad 57 on a silicon oxide layer portion 44 above the collector region, and a base contact layer in the form of two fingers 58 each of 3μ width which further extend over the silicon oxide layer portions 45 and 44 and terminates in a large area bonding pad 59 on the silicon oxide layer 44 above the collector region.

The slice is then sub-divided into a plurality of transistor units of 350μ x 350μ which are then individually mounted on a header, connections to the emitter and base bonding pads are made by wire bonding and encapsulation is effected in a manner as commonly employed in a planar transistor manufacture.

In the third embodiment now to be described with reference to FIGS. 9 to 13, the starting material is the same as in the previously described embodiments, that is, a silicon slice consisting of an $n^+$-type substrate having an n-type epitaxial layer thereon. A layer of silicon oxide of 3,000 A. thickness is grown on the surface of the epitaxial layer by maintaining the body at 1000° C. in a stream of wet oxygen for 45 minutes. By a photoprocessing and etching step an opening of 25μ x 30μ, is made in the silicon oxide layer to expose the underlying n-type epitaxial layer.

A further oxidation step is performed by maintaining the body at 950° C. in a stream of wet oxygen for 15 minutes. This results in the formation of a thin silicon oxide layer of approximately 1200 A. thickness on the surface portion exposed by the previous photoprocessing and etching step. The remaning parts of the initially formed thicker silicon oxide layer are increased in thickness by a small amount during the latter oxidation step. An opening of 3μ x 20μ is made in the thin silicon oxide layer to expose the underlying n-type epitaxial layer. This opening is centrally disposed within the previously formed 25μ x 30μ opening at which the thin silicon oxide layer is present.

Figure 9:
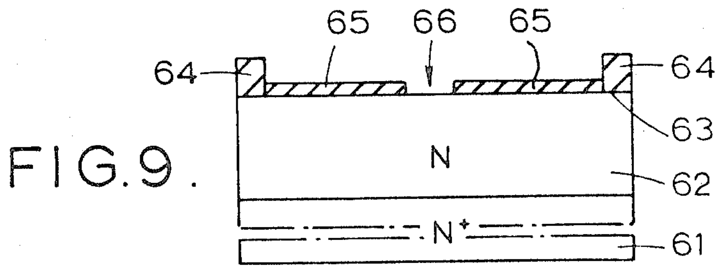
FIGS. 9 to 12 show vertical sections through a semiconductor body during various stages of a third embodiment of the method for the manufacture on an n–p–n silicon epitaxial planar transistor.

FIG. 9 shows the semiconductor body after this step with the $n^+$-type substrate 61 having the n-type epitaxial layer 62 thereon, a plane surface 63 of the layer having the initially formed thicker silicon oxide layer 64 thereon, the subsequently formed thin silicon oxide layer 65 on the part of the surface within the 25μ x 30μ opening in the thick layer 64, and the 3μ x 20μ opening 66 in the thin layer 65.

The body is placed in a diffusion furnace and maintained at 900° C. for 15 minutes in a gas stream containing phosphorus which is derived from phosphine ($PH_3$). This results in the diffusion of phosphorus into the portion of the n-type epitaxial layer exposed by the opening 66 and the formation of an $n^+$-type emitter region concentration adjacent the surface where the diffused phosphorus concentration is 1–5 x $10^{20}$ atoms/cc. During the diffusion step a layer of phosphosilicate glass is formed on the exposed portion of the silicon and to a smaller extent on the surface of the insulating layer parts.

Figure 10:
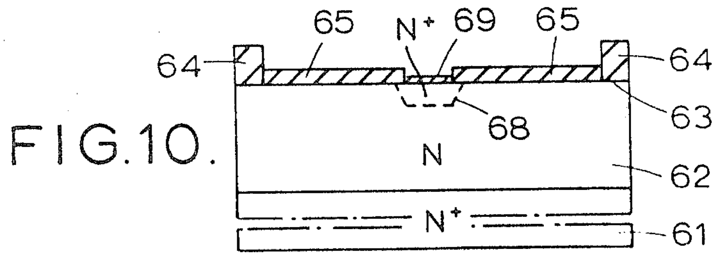

FIG. 10 shows the semiconductor body after the phosphorus diffusion step having the $n^+$-type emitter region concentration 67. The extent of the diffusion front is represented by the broken line 68. The phosphosilicate glass layer 69 has a thickness of approximately 500 A.

The body is removed from the diffusion furnace and a layer of aluminium of 1.0μ thickness is deposited on the surface of the insulating layer parts 64, 65 and 69.

By a further photoprocessing and etching step an opening of 25μ x 30μ is formed in the aluminium layer, said opening corresponding substantially in position to the location of the outer perimeter of the thin oxide layer 64.

The silicon body is then placed in the target chamber of an ion implantation apparatus and implantation of boron ions is effected into the body in the area exposed by the opening in the aluminium layer. The boron ion source consists of boron trichloride. The implantation energy is carried out in steps either with increasing or decreasing energies in the range of 10K ev. to 130K ev. at a dose of approximately $10^{14}$ $cm.^{-2}$ and the orientation of the body is such that there is an angle of 7° between the ion beam axis and the <111> direction. Implantation of boron ions occurs through the silicon oxide layer part 65, through the phosphosilicate glass layer 69 and through the previously diffused phosphorus concentration in the $n^+$-type region 67. During an annealing treatment at 600° C. to 800° C. for 30 minutes a base region and the locations of an emitter/base junction and a collector/base junction are simultaneously determined.

Figure 11:
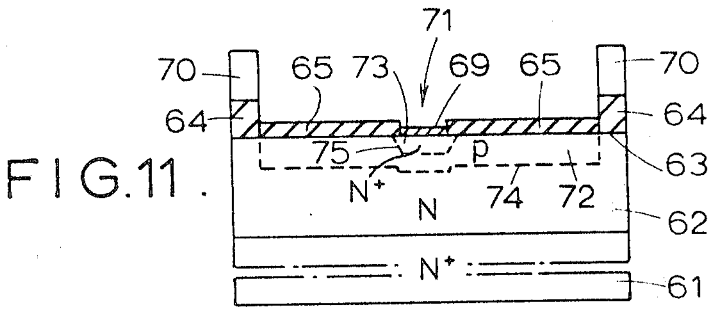

FIG. 11 shows the semiconductor body after the boron ion implantation just prior to the annealing treatment. The silicon oxide insulating layer part 64 is shown havng the aluminium masking layer 70 thereon with an opening 71 therein exposing the insulating layer parts 65 and 69 through which the boron ion implantation has been effected to yield a p-type base region concentration 72, an $n^+$-type emitter region concentration 73, a base/collector junction 74 and an emitter/base junction 75, the junctions being shown in dotted outline as it will be appreciated that their final location is determined by the subsequent annealing treatment. Furthermore the part of the collector/base junction 74 situated below the glass layer 69 is shown extending at a slightly greater distance from the surface 63 than the adjoining part of the junction 74. This is because boron ions implanted through the relatively thin glass layer 69 have a penetration which is slightly deeper than that of the boron ions implanted through the silicon oxide layer 65.

Subsequent to the boron implantation the residual aluminium masking layer 70 is removed and the annealing treatment as described above is carried out.

Figure 12:
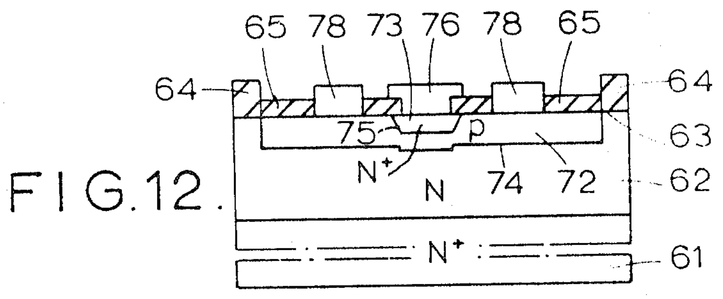
Figure 13:
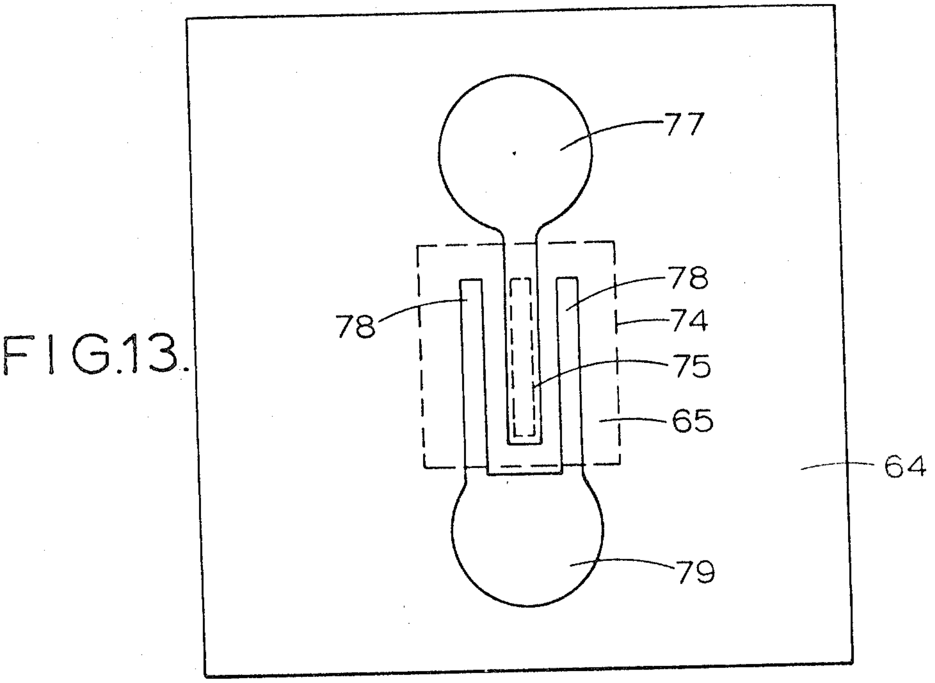
FIG. 13 shows in plan view the surface of the semiconductor body of the transistor manufactured by the third embodiment of the method.

After the annealing treatment the boron surface concentration in the base region 72 is approximately $10^{18}$ atoms/cc. The part of collector/base junction 74 below the glass layer 69 is situated at a depth from the surface 63 of 0.4μ to 0.5μ and the emitter/base junction is situated at a depth from the surface 63 of 0.25μ giving a base region width of 0.15μ to 0.25μ. The glass layer 69 is then removed by dipping in a very weak HF solution for about 5 seconds. By a further photoprocessing and etching step openings of approximately 3μ x 20μ are formed in the silicon oxide layer 65 to expose the base region 72 where it extends to the surface 63. A layer of aluminum of 0.5μ thickness is then deposited over the whole surface. The aluminium layer is selectively removed by a further photoprocessing and etching step to leave an emitter contact metal layer and a base contact metal layer as shown in FIGS. 12 and 13. The emitter contact layer is in the form of a finger 76 of 5μ width and is situated in the opening previously occupied by the glass layer 69, extends over the silicon oxide layer 65 on each side of said opening and terminates in a large area bonding pad 77 on the silicon oxide layer 64 above the collector region. The base contact layer is in the form of two fingers 78 each of 3μ width which further extend over the silicon oxide layer 65 and terminate in a large area bonding pad 79 on the silicon oxide layer 64 above the collector region.

The slice is then sub-divided into a plurality of transistor units of 350μ x 350μ which are then individually mounted on a header. Connections to the emitter and base bonding pads are made by wire bonding and encapsulation is then effected by a commonly employed method.

Figure 14:
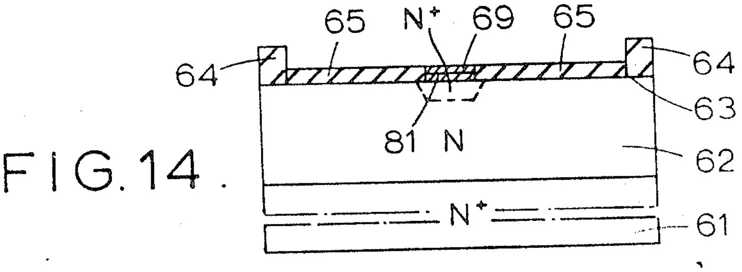
FIGS. 14 and 15 show vertical sections through a semiconductor body during two intermediate stages of a fourth embodiment of the method which is a modification of the third embodiment.
Figure 15:
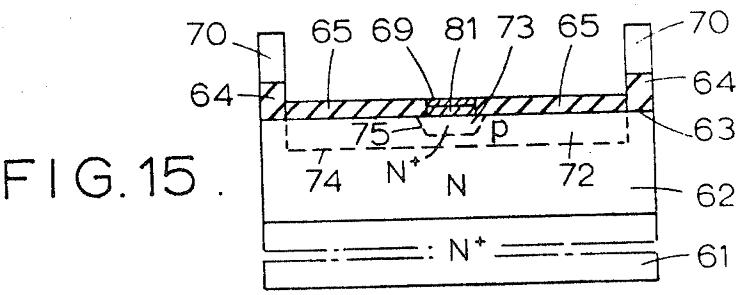

In the fourth embodiment now to be described with particular reference to FIGS. 14 and 15, the manufacturing procedure is identical to the stages in the previously described third embodiment up to and including the phosphorus diffusion step (FIG. 10). Corresponding parts of the semiconductor body and the layers thereon are indicated in FIG. 14 with the same reference numerals as used in FIGS. 9 and 10. After the phosphorus diffusion step and anodic oxidation step is performed in ethylene glycol and potassium nitrate solution (5% by wt.) to form an anodic oxide layer part 81 which grows at the interface between the silicon and the phosphosilicate glass layer 69, the total thickness of the insulating layer part 69, 81 corresponding substantially to the thickness of the adjacent insulating layer part 65. Thereafter the method is as described in the third embodiment, that is the aluminum masking layer 70 is provided and the boron implantation is effected. Due to the uniformity of thickness of the insulating layer parts through which the boron ions are implanted, the collector/base junction 74 does not dip below the emitter. This is shown in FIG. 15 which otherwise corresponds to FIG. 12. The composite layer 69, 81 is subsequently dissolved by dipping in a very weak HF solution for about 5 seconds. Thereafter the processing corresponds exactly with the corresponding stages of the third embodiment.

Many variations of the methods described in the preceding embodiments are possible within the scope of the invention. For example, in the second embodiment in which the emitter region concentration is formed by implantation of phosphorus ions, it may be desirable in certain circumstances to subject the portion of the silicon body which is to be occupied by the implantated phosphorus ions to an initial bombardment with ions which do not substantially affect the conductivity of the silicon in order to render the said body portion amorphous prior to the phosphorus ion implantation. It is found that such a treatment acts as an additional measure to restrict the process of channelling of the implantated phosphorus ions. Furthermore in a modification of the third and fourth embodiments in which the emitter contact metal layer is located in an opening in the insulating layer corresponding substantially to the initially defined opening used for the phosphorus diffusion, a multilayer metal contact system may be used to advantage, particularly where shallow junctions are concerned.

What we claim is:

1. A method of manufacturing a transistor comprising emitter, base and collector regions, comprising the steps of first forming in a semiconductor body part of one conductivity type at one surface thereof a shallow surface emitter region of the said one conductivity type by incorporating therein a relatively high concentration of one-type forming impurities, thereafter implanting into said body part from said one surface ions of an impurity of the opposite conductivity type over an area encompassing but larger than the emitter region and to a depth deeper than the emitter region such that the ions extend through the previously made emitter region to form a base region, said base ion impurity concentration exceeding the impurity concentration of the initial body part but being less than the emitter impurity concentration forming an opposite type base region defining spaced collector and emitter junctions which extend to the said one surface, and thereafter subjecting the assembly to a base annealing treatment to remove semiconductor ion damage.

2. A method as set forth in claim 1 wherein the emitter impurities are incorporated by ion implantation, and the assembly is subjected to an emitter annealing treatment to remove semiconductor ion damage prior to implantation of the base ion impurities.

3. A method as set forth in claim 2 wherein the emitter annealing treatment is carried out at a higher temperature than the base annealing treatment.

4. A method as set forth in claim 1 wherein prior to implantation of the base impurities, the said one surface is provided with an insulating layer and on the insulating layer an ion masking metal layer having an opening defining the base region to be formed, the ion implantation taking place through the insulating layer.

5. A method as set forth in claim 1 wherein the emitter impurities are incorporated by diffusion through an opening in an insulating layer on the said one surface, the opening being covered with a glass insulator during the diffusion step, and the base impurities are implanted through the insulating layer.

6. A method as set forth in claim 5 wherein the opening used during the emitter diffusion step is reopened following the annealing treatment and an emitter contact made to the emitter region through the reopening.

7. A method as set forth in claim 6 wherein the reopening is formed by selectively etching the glass insulator without substantially removing the adjacent parts of the insulating layer.

8. A method as set forth in claim 5 wherein following the emitter diffusion step but prior to the base impurity implantation step, the assembly is subjected to an anodic oxidation step until the thickness of the glass insulator in the opening is increased to a value substantially equal to that of the adjacent parts of the insulating layer.

9. A method as set forth in claim 2 wherein the body is of silicon, the base impurities are boron and the emitter impurities are phosphorus, and the emitter and base annealing treatments are carried out at temperatures of about 900° C. and 600°–800° C., respectively.

References Cited

UNITED STATES PATENTS

| | | | |
|---|---|---|---|
| 2,802,760 | 8/1957 | Derick et al. | 148—187 |
| 3,226,611 | 12/1965 | Haenichen | 148—187 |
| 3,388,009 | 6/1968 | King | 148—1.5 |
| 3,391,035 | 7/1968 | Mackintosh | 148—189 |
| 3,431,150 | 3/1969 | Dolan, Jr., et al. | 148—1.5 |

HYLAND BIZOT, Primary Examiner

R. A. LESTER, Assistant Examiner

U.S. Cl. X.R.

29—571; 148—1.5, 186

PO-1050
(5/69)

UNITED STATES PATENT OFFICE
CERTIFICATE OF CORRECTION

Patent No. 3,595,716 Dated July 27, 1971

Inventor(s) JOHN ANTHONY KERR and ERIC WADHAM

It is certified that error appears in the above-identified patent and that said Letters Patent are hereby corrected as shown below:

In the title page, Col. 1, lines 8 and 9, "Claims priority, application Great Britain, May 16,1968, 24,762/68" should read -- Claims priority, application Great Britain, May 26, 1967, 24,762/67 --.

Signed and sealed this 30th day of May , 1972 .

(SEAL)
Attest:

EDWARD M.FLETCHER,JR.
Attesting Officer

ROBERT GOTTSCHALK
Commissioner of Patents